United States Patent [19]

Granot

[11] Patent Number: 4,855,679
[45] Date of Patent: Aug. 8, 1989

[54] MAGNETIC RESONANCE STUDIES OF RESTRICTED VOLUMES

[75] Inventor: Joseph Granot, Holon, Israel
[73] Assignee: Elscint Ltd., Haifa, Israel
[21] Appl. No.: 172,398
[22] Filed: Mar. 24, 1988

[30] Foreign Application Priority Data

Mar. 27, 1987 [IL] Israel ......................................... 82029

[51] Int. Cl.[4] ............................................ G01R 33/20
[52] U.S. Cl. ..................................... 324/309; 324/307
[58] Field of Search ............... 324/300, 307, 309, 310, 324/312; 128/653

[56] References Cited

U.S. PATENT DOCUMENTS

| | | | |
|---|---|---|---|
| 4,480,228 | 10/1984 | Bottomley | 324/309 |
| 4,649,346 | 3/1987 | Yeung et al. | 324/312 |
| 4,754,223 | 6/1988 | In Den Kleef et al. | 324/309 |
| 4,777,439 | 10/1988 | Granot | 324/309 |

OTHER PUBLICATIONS

P. C. Lauterbur, "Image Formation by Induced Local Interactions: Examples Employing Nuclear Magnetic Resonance", published in *Nature* (London) 242, 89/90.
R. E. Gordon et al., "Volume Selection for High Resolution NMR Studes" in the Proceedings of the SMRM Third Annual Meeting, 1984, at pp. 272 et seq.
W. P. Aue et al., "A Selective Volume Method for Performing Localized NMR Spectroscopy," in the *Journal of Magnetic Resonance*, vol. 56, pp. 350 et seq.
R. J. Orididge et al., "Imaged-Selected in Vivo Spectroscopy (ISIS) A New Technique for Spatially Selective NMR Spectroscopy" in the *Journal of Magnetic Resonance*, vol. 66, pp. 283-294 (1986).
P. R. Luyten et al., "H MR Spatially Resolved Spectroscopy of Human Tissues in Situ," published in *Magnetic Resonance Imaging*, pp. 237-239 (1986).
D. M. Doddrell et al., "Spatial and Chemical Shift-Encoded Excitation, *Space*, a New Technique for Volume-Selected NMR Spectroscopy" published in the *Journal of Magnetic Resonance*, pp. 367-372.

*Primary Examiner*—Stewart J. Levy
*Assistant Examiner*—Louis M. Arana
*Attorney, Agent, or Firm*—Sandler & Greenblum

[57] ABSTRACT

Apparatus for spatial localization in magnetic resonance (MR) systems applicable to both imaging and spectroscopy. Spatial localization provides data from a volume of interest (VOI) by means of selective inversion followed by the application of a modified spin-echo sequence having a second slice selection gradient used with the 180° pulse being orthogonal to a first slice selection gradient used with the 90° pulse. The selective inversion 180° pulse is applied in the presence of a third selection gradient which is orthogonal to the other selection gradient pulses. This basic sequence is applied twice with the preinversion pulse absent in the second application. The resulting signals are substracted from one another to obtain a net localized signal from the VOI.

24 Claims, 3 Drawing Sheets

MAGNETIC RESONANCE STUDIES OF RESTRICTED VOLUMES

FIELD OF THE INVENTION

This invention relates to nuclear magnetic resonance imaging (MRI) and more particularly to methods for spatially restricting the volume of interest for MRI. A related application by the inventor herein is the patent application filed in the U.S. on Mar. 20, 1987, which received serial number 028,204 and has issued as Pat. No. 4,777, 439.Another related application is the patent application first filed in the U.S. on Sept. 20th, 1984, which received Ser. No. 652,462 which has since issued as Pat. No. 4,644,280. Each of the patents is assigned to the assignee of this invention.

BACKGROUND OF THE INVENTION

Nuclear magnetic resonance (NMR) chemical shift spectroscopy has been in use for a relatively long time In 1973 P. C. Lauterbur in an article published in Nature (London) 242, 89/90 disclosed the use of field gradients for determining the source location of free induction decay (FID) signals obtained in NMR experiments. The knowledge of the source of the FID signals enables the MR acquired data to be used to reconstruct interior images of the subject placed in a strong magnetic field.

It has been known that when atomic nuclei that have net magnetic moments are placed in a strong static magnetic field, the nuclei ("spins") precess about the axis of the field at the Larmor frequency given by the equation:

$$f = \gamma B_o / 2\pi$$

in which:
 $\gamma$ is a gyromagnetic ratio, constant for each NMR isotope which exhibits a net magnetic moment;
 $B_o$ is the strength of the magnetic field; and
 $\pi$ is the well known constant 3.1416+.

As is well known magnetic resonance imaging (MRI) uses a relatively strong static magnetic field having a given direction which is aligned with the Z axis of a cartesian coordinate system. The strong static magnetic field causes the nuclei or "spins" of certain elements such as hydrogen to align with the field. Subsequently radio frequency pulses of sufficient amplitude and/or time duration are applied to perturb or "tip" the aligned "spins". The rotational frequency of the RF precession and the frequency of the RF pulse is the above noted Larmor frequency.

After the termination of the RF pulse the rotated spins tend to realign with the static magnetic field. The precession of the transverse component in the magnetic field generates RF signals also having a Larmor frequency. These signals are known as free induction decay (FID) signals. It is these signals that are received to provide information on the spin density of the element whose spins have been rotated by the RF pulse. The spin density information is used for imaging.

There are many different methods used for obtaining the FID signals. Among the methods and probably one of the most popular methods at the present time is the spin echo method. This method is well known and will not be elaborated on herein.

In imaging, in general, the scientists are always endeavoring to increase the spatial resolution and lower the time required to provide the image. These are contrary aims; that is decreasing the time generally may require decreasing the resolution and generally will adversely effect the signal to noise ratio. Thus, a method for decreasing the time while maintaining the same resolution and/or signal to noise ratio or a method for increasing the resolution while imaging during the same time period is highly desirable. In MR imaging, increasing the time of acquiring an image does not pose any known danger to the patient because there is no dangerous radiation being used; nonetheless, since patient comfort and throughput are important considerations effecting both the picture quality and the economics of the system, clincians and imaging scientists are always interested in decreasing the time required for acquiring images. In some cases the time saved might be used for accumulating several images of the same slice and subsequently averaging the several images to improve in the signal-to-noise ratio.

A further desired by imaging scientists is to be able to zoom during the acquisition stage. In other words, during the imaging process if a particular portion of the body shows an interesting manifestation; it is often desirable to zoom in on this maifestation and to thereby focus on the manifestation to the exclusion of other data. This was in the past often accomplished in MRI systems as a computer step after the acquisition of the data, especially if the imaging is to be accomplished within a given time frame. However, no increase of the spatial resolution can be achieved by such manipulation of the data. The second of the above referred to patent applications taught one method of zooming during the acquisition of data. Such zooming could increase the resolution of the portion of the image focused upon in a natural manner.

A problem encountered when zooming during the acquisition of data is that "aliasing" artifacts caused by undersampling may be generated unless the number of encoding cycles is increased with a proportional increase of the total acquisition time. The relationships between the field of view, the resolution and the data acquisition time are shown as follows:

The size of the volumetric aquisition matrix is:

$$n_x \cdot n_y \cdot n_z$$

where $n_x$, $n_y$ and $n_z$ denote the size of the matrix along the X, Y and Z axis, respectively.
The volume of a voxel is $V = l_x \cdot l_y \cdot l_z$
where $l_x$, $l_y$ and $l_z$ are the dimension along the X,Y and Z axis, respectively.
The field of view FOV is FOV $= l_i * n_i$ where $i = x,y,z$.
The resolution L at voxel n is:

$$L = n_i / FOV_i$$

The data acquisition time Ta is:

$$Ta = TR \cdot n_x \cdot n_y \text{ (assuming phase encoding along the X and Y axes),}$$

where TR is the repetition time

It is apparent that restricting the FOV increases the resolution with a fixed acquisition matrix. Similarily restricting the FOV with a fixed resolution will decrease the acquisition time.

Localization of the volume of interest is critically important for medical diagnostic applications of magnetic resonance spectroscopy (MRS) and is useful for MRI. Selection of a cubic volume has been achieved in the prior art by a variety of techniques and system arrangements. For example, the application of RF pulse sequences comprising three consecutive tailored RF pulses, each in the presence of a different one of the three orthogonal gradients can be used to select a desired cubic volume.

The use of pulse sequences such as 90 degrees, 180 degrees and 180 degrees has been reported by R. E. Gordon et al., in a report entitled "Volume Selection for High Resolution NMR Studes" in the Proceedings of the SMRM Third Annual Meeting, 1984 at pp 272 et seq.

A pulse sequence for spatial localization using a composite pulse such as selective 45 degrees, non-selective 90 degrees and selective 45 degrees with the composite pulse applied three times, each time with one of three orthogonal gradients, has been reported in an article entitled "A Selective Volume Method for Performing Localized NMR Spectroscopy", by W. P. Aue et al. in the Journal of Magnetic Resonance, vol 56 pp 350 et seq. The method of the article is the subject of the U.S. Pat. No. 4,480,228 which was issued on Oct. 30, 1984.

A pulse sequence for spatial localization in spectroscopy using combinations of three selective 180 degree pulses and a non-selective 90 degree pulse is described in an article entitled "Image-Selected in Vivo Spectroscopy (ISIS). A New Techinque for Spatially Selective NMR Spectroscopy" by R. J. Ordidge et al. in the Journal of Magnetic Resonance, vol. 66, pp 283-294 (1986).

Yet another pulse sequence for spatial localization in spectroscopy is revealed in an article entitled "'MR Spatially Resolved Spectroscopy of Human Tissues in Situ" by P. R. Luyten et al. published in Magnetic Resonance Imaging, vol 4, pp 237-239 (1986).

Another pulse sequence for volume selection in magnetic resonance spectroscopy is explained in an article entitled "Spatial and Chemical—Shift-Encoded Excitation. SPACE, a New Technique for Volume-Selected NMR Spectroscopy" by D. M. Doddrell et al. published in the Journal of Magnetic Resonance, vol. 68, pp 367-372 (1986).

The selective 90-180-180 and the non-selective 90-180-selective 90 prior art pulse sequence procedures for spatially localizing the received NMR signals yields signals that are strongly dependent on the T2 relaxation times of the spins. This dependance on the T2 relaxation times makes it difficult to detect signals with short T2 relaxation times.

The method taught by Aue et al., i.e. the composite 45 degree—non-selective 90 degree and selective 45 degree pulse sequence requires a very high RF power and appears to be plagued by off-resonance precessional effects (see the Doddrell et al. article) that occur during the composite pulse transmission. These effects adversely effect the signal to noise ratio (SNR).

The method of Ordidge et al. is sensitive to subtraction noise and requires extremely accurate magnetic field stability to insure the exact cancellation of signals obtained from spins that are not in the volume of interest (VOI). Also, there may be a proclivity towards instrumentation problems that interfere with the efficient detection of weak signals.

The method of Doddrell et al provides relatively high power deposition and has relatively high "subtraction noise".

The method of the above mentioned second patent application has low power deposition and T2 dependence but of course uses the signals of stimulated echoes as compared with signals of a full echo.

Thus, there is still a need for an MR system that will use a full echo sequence to obtain data from selected volumes for use in spectroscopy or in imaging which will not be heavily T2 dependent, will effectively limit the RF pulse power deposition and the sensitivity to subraction noise and in addition will effectively limit the acquisition of signals to the selected volume of interest.

BRIEF DESCRIPTION OF THE INVENTION

Accordingly it is an object of the present invention to obtain MR images from restricted volumes by means of spatially localized signals, using selective pre-inversion pulses as part of the process of volume selection. More particularly, according to the present invention, a method for performing restricted volume MR studies is provided, said method comprises the steps of:

aligning spins in a sample by positioning said sample in a homogeneous static magnetic field for obtaining NMR derived data from the sample, applying a first basic scan sequence including the steps of:

irradiating said sample with a first radio frequency (RF) pulse in the presence of a first magnetic gradient so as to selectively invert the aligned spins in a planar slice of said sample, applying a modified spin echo sequence to obtain a selected strip having a sub-strip wherein the spins are 180 degrees out of phase with the spin in the rest of the selected strip, the sub-strip being a part of the planar slice, applying a second basic scan sequence including the steps of:

applying the modified spin echo sequence to obtain said strip without the sub-strip, and combining the strips of said first and second modified spin echo sequences to retain only the sub-strip.

A related of the invention eliminates or suppresses unwanted FIDs and echoes.

A further feature of the invention utilizes selection gradients that extend past the first RF pulse and begin before the second RF pulse in order to destroy coherence or applies spoiler gradients in the time interval between the second and third RF pulses. These gradients may be applied along the X and/or Y and/or Z axes.

Yet another feature of the invention includes the application of an extra gradient pulse along the viewing axis after the application of the second RF pulse for dephasing. Still another feature of the invention includes the application of one encoding gradient if a two dimensional project of the three dimensional is to be imaged and the application of two encoding gradients along two axes if a three dimensional projection of the three dimensional slice is to be imaged.

Still another feature of the invention includes applying the encoding gradient or gradients and/or applying the dephasing gradient along the viewing axis between the first and second RF pulses or between the third RF pulse and the viewing gradient pulse.

Yet another feature of the invention is that both the position and the size of the volume can be readily selected by appropriate choice of frequency and/or bandwidth of the three RF pulses along with controlling the strength of the selective gradients. The choice is made according to the following equations:

slice position $x = 2\pi \Delta of/Gx$; and
slice width $x = 2\pi \Delta F/Gx$ where:
x is the location along the X axis, (as an example, could also be the Y or Z axis);
of is an offset frequency (added to the Larmor frequency); and
$\Delta F$ is the bandwidth of the RF pulse.

Another feature of the invention is that the selective inversion procedure enables the simultaneous acquisition of data from multiple localized volumes, using methods such as disclosed in U.S. Pat. application Ser. No. 892,063 filed on 1st Aug. 1986.

BRIEF DESCRIPTION OF THE DRAWINGS

The above mentioned and other features and objects of the present invention will be best understood when considered in the light of the following description made in conjunction with the accompanying drawings, wherein.

GENERAL DESCRIPTION

Figure 1:
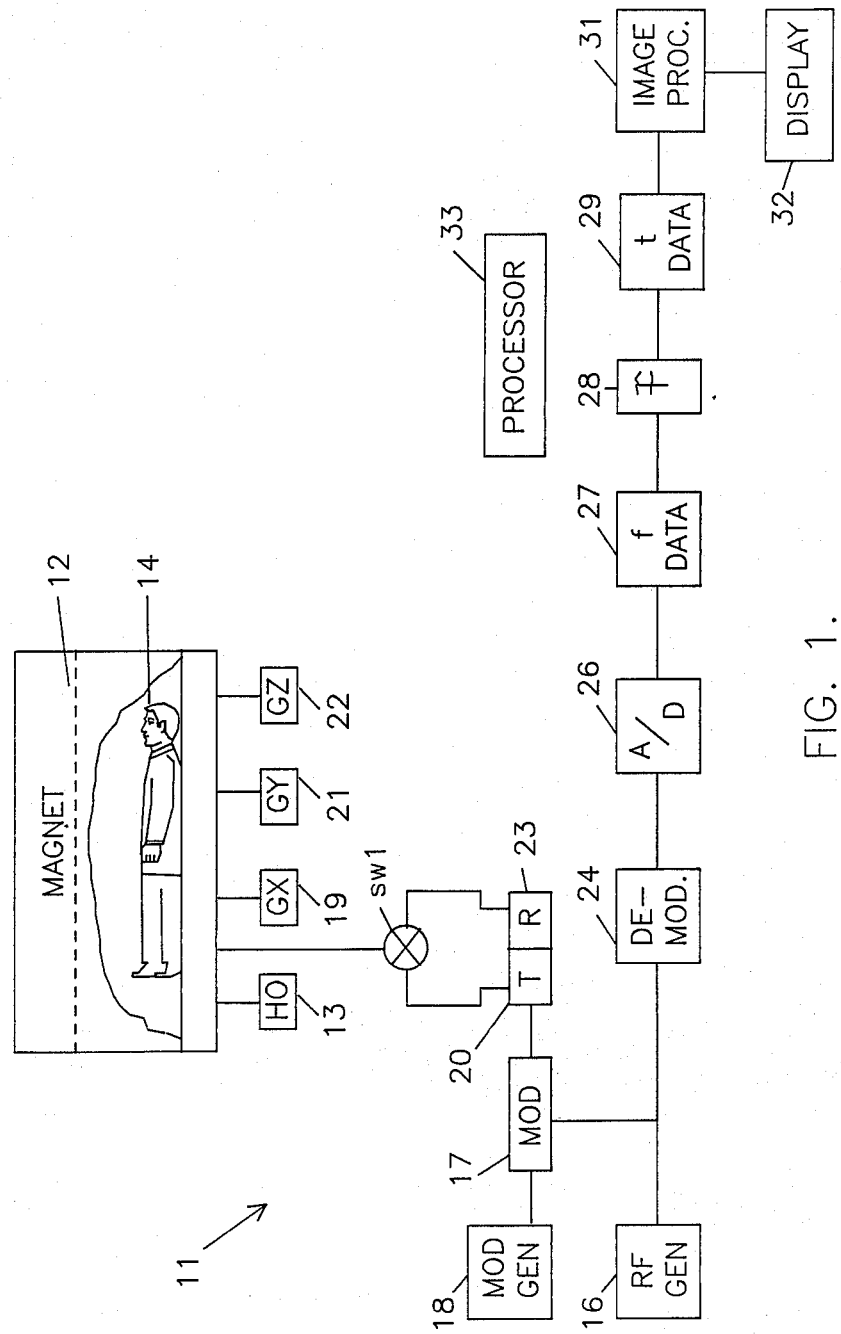
FIG. 1 is a block diagram showing of a typical NMR data acquisition system.

FIG. 1 at 11 shows in block diagram form an in vivo magnetic resonant data acquisition system. The system includes a magnet 12 for generating a large static magnetic field. The magnet is sufficiently large to have a bore into which a patient 14 can fit. The magnetic field is generated by a magnetic field generator indicated at 13 by block Ho. The RF magnetic pulses are generated utilizing RF generator 16. The pulses are shaped using modulator 17. The shape of the pulse could be Gaussian or Sinc, for example as determined by the modulator frequency generator 18. Shaped pulses in the presence of a selective gradient act to restrict the area of the sample effected by the RF pulse.

Figure 3:
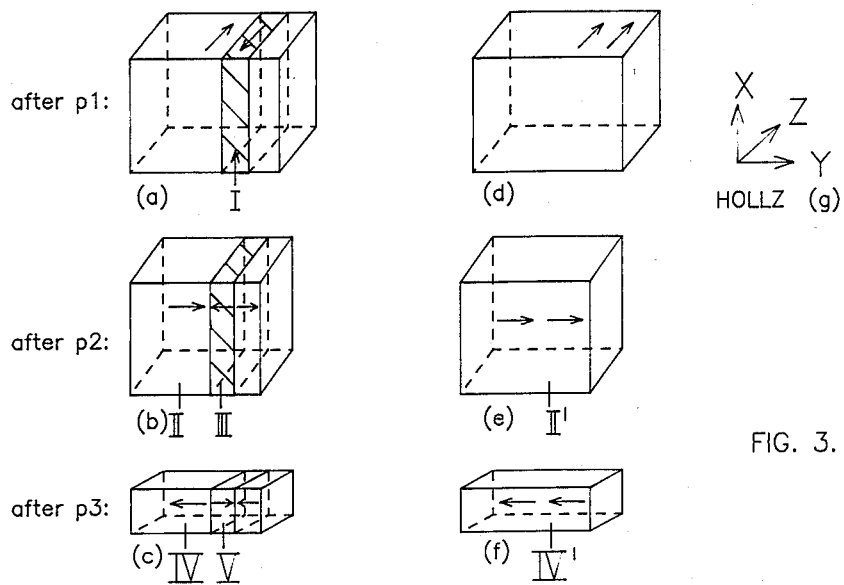
FIG. 3 is a pictorial sequential showing of a selected volume of interest in a selected strip in a selected slice of a sample using the two basic scan sequences of FIG. 2, and FIG. 4 graphically depicts the FID signals and echoes normally generated by three pulse sequences.
Figure 4:
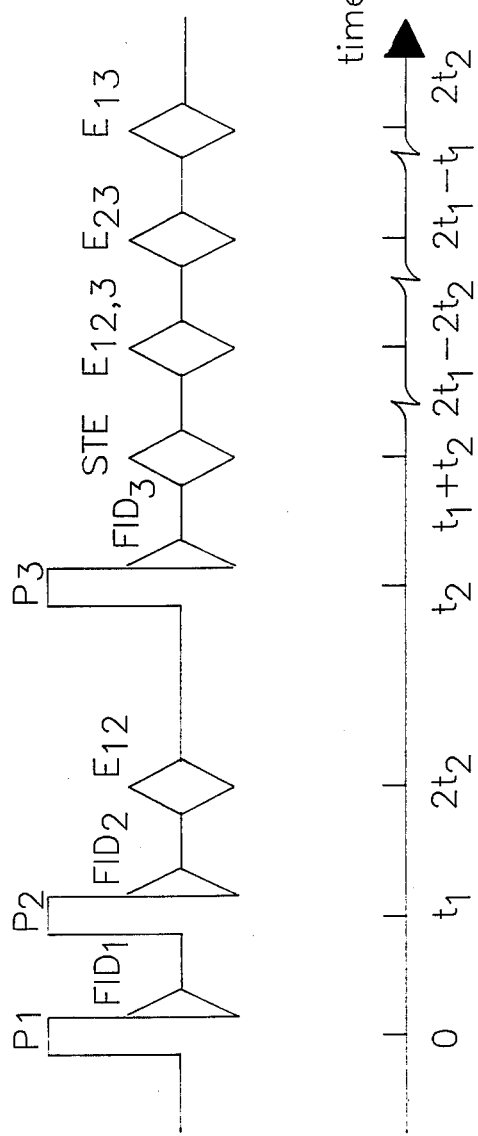

The modulated RF pulse signal is transmitted to body coils in the magnet, not show. The coils could also be surface coils or head coils, within the scope of this invention. The RF pulses are applied in the presence of gradients such as X, Y or Z gradients generated by gradient generators 19, 21 or 22 respectively. According to the invention, the first RF pulse P1 (FIGS. 2, 3 and 4) is an inverting pulse; i.e. a 180 degree pulse transmitted by the transmitter 20 in the presence of gradient pulse GY (FIG. 2) to invert the aligned spins in a selected planar section I (FIG. 3) of the volume of the patient 14 that is subjected to the study. In a preferred embodiment the first RF pulse is a composite inverting pulse. The composite pulses are less sensitive to offset effects.

At a specified time, say t1, after the application of the first RF pulse P1, the second RF pulse P2, a 90 degree pulse is applied. The second RF pulse is preferably also shaped. It is applied in the presence of a magnetic field gradient that is orthogonal to the gradient applied during the application of the first pulse, P1. For example, the gradient Gz generated by gradient generator 22 is applied. The 90 degree pulse in the presence of the magnetic gradient in the Z direction tips the spins in a slice II by 90 degrees. The slice II includes a strip III which is the part of slice I wherein the spins are now 180 degrees out of phase with the remaining spins in the slice II. Thus, the first RF pulse P1 tips the aligned spins in the slice I by 180 degree. The second RF pulse P2 tips spins in slice II 90 degrees. Since the spins in strip III were previously inverted, when they are also tipped by 90 degrees they remain inverted with respect to the spins not previously inverted.

At a time as time t2 (FIG. 4) for example, after the application of the second RF pulse P2, a third RF pulse P3 is applied. The pulse P3 is a second 180 degree pulse which preferably also shaped. The third pulse P3 is applied in the presence of a gradient pulse Gx generated by the gradient generator 19 orthogonal to the other two gradient pulses. The third RF pulse in the presence of the gradient excites the spins and obtains echoes from a strip indicated as IV. The excitation of the spins in the strip IV includes the spins of the sub-strip V. The sub-strip V is the V0I. It is the strip formed by the intersection of strips III and IV. Thus the junction of strips III and IV actually define the volume V.

The received signals are detected by receiver coils in the magnet which are not shown. The receiver coils and the transmitter coils may be the same. The received signal is received by receiver 23 and demodulated by demodulator 24. The demodulated signal is amplified and processed in the analog to digital processing unit 26 to provide frequency data as indicated at 27. The frequency data is operated on by a Fourier transform operator 28 for conversion to time data shown at 29. The time data is processed in image processor 31 to provide the image to display unit 32. The entire process is monitored and controlled by the processor 33.

Figure 2:
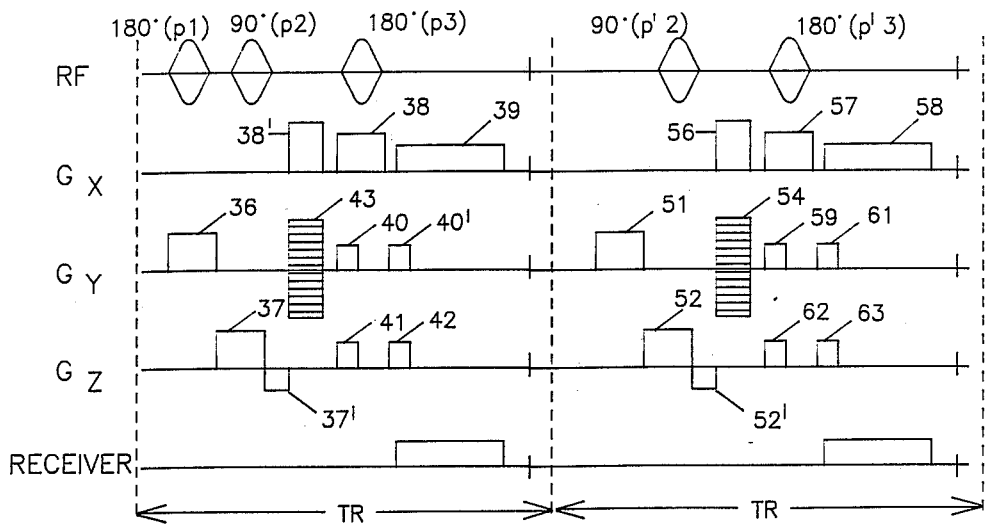
FIG. 2 is a showing of two basic RF pulse scan sequences comprising the full scan sequence used to obtain the imaging data from a restricted volume according to the invention.

The pulse sequences are clearly indicated in FIG. 2. Therein, the first shaped RF pulse P1 is shown as being applied in the presence of a Y gradient 36. This selective pulse causes pre-inversion of the spins in selected slice I (FIG. 3a). The slice I is in or parallel to the XZ plane as indicated by the indicated coordinate system of FIG. 3(g).

After a time t1, the second RF shaped pulse P2 is applied. In a preferred embodiment it is of sufficient time magnitude to tip the RF spins in a selected sample by 90 degrees. The pulse P2 is applied in the presence of a Z gradient 37 so as to effect only the spins in slice II in the patient. Slice II is in or parallel to the XY plane.

At a time t2 after the application of the pulse P2, a third shaped RF pulse P3 is applied, in the presence of an X gradient 38 to selectively excite the spins in the strip IV, which is the YZ plane or parallel thereto. In a preferred embodiment a "spoiler" gradient pulse 38' is used between RF pulses P2 and P3.

The application of the three pulses and the three gradients as described selects the strip IV. The size and location of the volume is controlled by the processor 33 which controls the characteristics of the gradients and the RF amplitude, duration and frequency of the pulses.

At a time t2 after the application of pulse P3, the echo signal E23 is received in the presence of a view gradient 39.

In a preferred embodiment, the slice selecting, gradient pulse 37 as shown in FIG. 2 has a negative portion 37' applied after the associated RF pulse terminates. The negative portion 37' extends for about half of the area of the positive portion of the gradient pulse 37 and is used for refocusing the spins.

Note that the third gradient pulse also has a negative portion 39 that is applied after the termination of the third RF pulse. The negative portion extends for approximately half of the area of the positive portion of the same pulse.

Spoiler gradient pulse 38' associated with gradient pulse 38, and/or dephasing gradient pulses 40, 41 associated with gradient 36 and dephasing pulses 41, 42 accociated with gradient pulse 37 are shown applied in the time intervals between pulses P2 and P3 and immediately before and after the third RF pulse P3, respectively, in order to destroy coherence.

A phase encoding gradient is indicated in FIG. 2 as being applied between pulses P2 and P3 of the first sequence along the Y axis. A single phase encoding gradient series, such as shown at 43, results in a two dimensional projection image of the selected volume. The application of a second phase encoding gradient series would result in a three dimensional projection image of the selected volume.

The second basic scan sequence of FIG. 2 is the modified spin echo sequence that was used in the first basic scan sequence except that the selective pre-inversion pulse (RF) is not used. Thus the second scan sequence of FIG. 2 starts with a Gy gradient pulse 51. The pulse 51 is the same as the gradient pulse 36 of the first scan sequence. Gradient pulse 51 is used even in the absence of the inversion pulse P1 because all things are done to assure that the strips obtained by the scans are identical (except for the inversion of pulse P1) to thereby minimize subtraction errors. For example, eddy currents are generated by gradients; therefore, if the first basic sequence has a gradient not found in the second basic sequence there will be eddy current effects that are not cancelled when combining the results of the first and second basic sequences.

Subsequently an RF pulse P'2 is transmitted in the presence of the GZ gradient pulse 52. The pulse 52 has a negative portion 52 similar to the negative portion 37 of gradient pulse 37 of the first scan sequence.

As in the first scan sequence phase encoding pulses 54 are applied. A spoiler gradient pulse 56 is applied at about the same time. Then the RF pulse P'3 is applied during the application of the X gradient pulse 57. During receipt of the echo, the viewing gradient pulse 58 is applied. Other spoiler and dephasing pulses 59, 61 and 62, 63 are applied on both sides of RF pulse P'3 respectively. In addition, the gradient pulses mimic the first sequence in their amplitudes and timing. Thus pulse 52 extends prior to pulse P'2 and pulse 57 extends on both sides of pulse P'3. Pulse 51 extends before and after the position of the absent pre-inversion pulse P'1.

The effects of the second scan sequence is shown in FIG. 3(d) to 3(f). FIG. 3(d) shows the volume of the subject in the large static field with the "spins" aligned and without any pre-inversion. FIG. 3(e) show slice II obtained responsive to the selective P'2 without any pre-inverted strip. FIG. 3(d) shows the strip IV' obtained responsive to the selective P3'. Note there is no strip V'. Combining strips IV and IV', such as by complex subtraction, provides 2 times the signals of strip V (the desired VOI) exclusively.

A method to implement the "multivolume mode" is by application of the full sequence, a plurality of times during the repetition time interval. Each repetition chooses a different volume anywhere within the organ under study. The only restriction, to avoid signal saturation, is that no two volumes share a common plane. An efficient way to achieve a "multivolume acquisition mode" is by applying n pre-inversion pulses, before P2, each one with a different offset frequency to invert the spins of n slices within the object. Appropriate choice of the offset frequencies of P2 and P3 will determine the final positions of the n VOIs. To avoid signal saturation care must be taken that no two selected volumes will share a common plane.

The system can also be used for 3D imaging by using a second phase encoding gradient pulse along another axis.

The requirement for a minimum of two acquisitions may be considered as a drawback when applying the system described to localize imaging. However, in practice since the field-of-view may well be small, in proportion to the size of the VOI, signal averaging may be needed anyhow to improve the SNR. Localized spectroscopy in vivo also usually requires signal averaging. For maximum SNR from the VOI it would be required to have $t1 << T1$ and $t2 << T2$, where t1 and t2 are the time intervals between P1 and P2 and between P2 and P3, respectively. Note however that if these conditions are not met the only result will be some sensitivity loss but not any contamination of the signal from the VOI by signals from outside the VOI. In spectroscopic applications, time dependent magnetic fields caused by eddy currents induced in the magnet bore by the switching gradients may bring deterioration of the spectral resolution. This effect can be minimized by lengthening t2, to introduce a longer delay between excitation and signal detection (albeit with concomitant stronger dependence of the signal strength on the T2 relaxation).

Under conditions of non-ideal RF pulses or inhomogeneous RF fields, such as may be encountered in whole-body MRI, especially when surface coils are employed, care must be taken to supress any unwanted signals that may be generated. Such spurious signals can include the FID signals following the RF pulses (FID1, FID2, FID3), the two-pulse echoes E12 and E13, and the regular (E123) and stimulated (STE) echoes generated by three pulses P1, P2 and P3.

In general, elimination of the unwanted signals can be accomplished, as described, by means of "spoiling ."gradients. Also phase cycling can be used. Thus, for example extending the selection gradient of P1 past P1 or that of P2 before P2 will dephase any coherence created by P1. It will also serve to prevent the formation of E12, E13 and E123. Symmetrical extension of the selection gradient of P3 about P3 as well as additional spoiling gradients along the other axes, placed before and after P3, will eliminate or strongly supress FID2, FID3 and the stimulated echo. Alternate inversion of the phase of P1 and summation of the acquired signals (after P3) will eliminate E12, E13, E123 and the stimulated echo. Alternate inversion of the phase of P3 and alternate addition/subtraction of the detected signals will eliminate E12, E13, E123 and FID3. A four-step phase cycle with phase inversions of both P1 and P2 will essentially eliminate all the unwanted signals.

Thus a system is provided for acquiring volume restricted imaging data in which the dependence on T2 relaxation time is reduced. The RF power applied during the designated sequence is much lower than that necessitated in the use of the normal spin echo sequence. The technique described above provides for unique spatial localization for MRI and also provides a predominant T1 contrast in the image as compared to the predominant T2 contrast of the regular spin echo images.

While the foregoing invention has been described using preferred embodiments, it should be understood that the preferred embodiment are shown by way of example only and not as limitations on the scope of the invention.

What is claimed is:

1. A method for performing restricted volume magnetic resonance (MR) studies comprising the steps of:
   aligning spins in a subject by positioning the subject in a strong static magnetic field,
   using a first basic scan sequence comprising the steps of:
   irradiating said subject with a first RF pulse in the presence of a first magnetic gradient so as to invert the aligned spins in a first selected volume of said subject,
   irradiating said subject with a second RF pulse in the presence of a second magnetic gradient normal to said first magnetic gradient so as to tip the aligned spins into a transverse plane in a selected slice of said selected volume,
   irradiating said sample with a third RF pulse in the presence of a third magnetic gradient normal to said first and second magnetic gradients to obtain signals from a selected strip of said selected slice,
   using a second basic scan sequence that includes the steps of the first basic scan sequence without the first RF pulse, and
   combining the signals of the first and second basic scan sequences to obtain data from a selected VOI.

2. The method of claim 1 wherein the first and third RF pulses are 180° pulses and the second RF pulse is a 90 degree pulse and the obtained signals are echo signals.

3. The method of claim 1 wherein the first pulse is a composite inverting pulse.

4. The method of claim 1 wherein the first basic and second basic scan sequences comprise phase encoding gradient pulses to enable obtaining a 2-D image.

5. The method of claim 4 where the phase encoding gradients are along the axis of the first magnetic gradient.

6. The method of claim 1 wherein the first and second basic scan sequences each include two sets of encoding gradient pulses to enable obtaining a 3-D image.

7. The method of claim 6 wherein a first set of said two sets of encoding gradient pulses is along the axis of the first magnetic gradient pulse and said second set of said two sets of encoding gradient pulses is along the axis of the second magnetic gradient pulse.

8. The method of claim 1 including applying spoiler and dephasing pulses in the basic scan sequences.

9. The method of claim 1 including applying spoiler gradient pulses between the first and second RF pulses.

10. The method of claim 1 including using asymetrical gradient pulses to eliminate unwanted signals.

11. The method of claim 1 including the steps of applying n first RF pulses prior to the application of the second RF pulse, each of the n first pulse having a different offset frequency for obtaining signals from a multiplicity of selected VOI's.

12. The method of claim 1 wherein only the second basic scan sequence is used to obtain signals from a selected strip.

13. A system for performing restricted volume magnetic resonance (MR) studies comprising:
   means for aligning spins in a subject by positioning the subject in a strong static magnetic field,
   means for applying a first basic scan sequence comprising:
   means for irradiating said subject with a first RF pulse in the presence of a fist magnetic gradient so as to invert the aligned spins in a first selected volume of said subject,
   means for irradiating said subject with a second RF pulse in the presence of a second magnetic gradient normal to said first magnetic gradient so as to tip the aligned spins into a transverse plane in a selected slice of said selected volume,
   means for irradiating said sample with a third RF pulse in the presence of a third magnetic gradient normal to said first and second magnetic gradients to obtain signals from a selected strip of said selected slice,
   means for applying a second basic scan sequence that contains all of the pulses of the first basic scan sequence without the first RF pulse, and
   image processing means for combining the signals of the first and second basic scan sequences to obtain data from a selected VOI.

14. The system of claim 13 wherein the first and third RF pulses are 180 degree pulses and the second RF pulse is a 90 degree pulse and the obtained signals are echo signals.

15. The system of claim 13 wherein the first pulse is a composite inverting pulse.

16. The system of claim 13 including means for applying phase encoding gradient pulses during said first and second basic scan sequences to enable obtaining a 2-D image.

17. The system of claim 16 including means for applying the phase encoding gradients along the axis of the first magnetic gradient.

18. The system of claim 13 including means for applying two sets of encoding gradient pulses during the first and second basic scan sequences to obtain a 3-D image.

19. The system of claim 18 wherein said means for applying two sets comprises means for applying a first set of said two sets of encoding gradient pulses along the axis of the first magnetic gradient pulses and said second set of encoding gradient pulses along the axis of the second magnetic gradient pulse.

20. The system of claim 13 including means for applying spoiler and dephasing pulses in the basic scan sequences.

21. The system of claim 13 including means for applying spoiler gradient pulses between the first and second RF pulses.

22. The system of claim 13 including means for applying asymetrical gradient pulses to eliminate unwanted signals.

23. The system of claim 13 including means for applying n first RF pulses prior to the application of the second RF pulse, each of the n first pulses having a different offset frequency for obtaining signals from selected VOI's.

24. The system of claim 13 including only means for applying the second basic scan sequence to obtain signals from a selected strip.

* * * * *